United States Patent
Lu et al.

(10) Patent No.: US 7,409,622 B1
(45) Date of Patent: Aug. 5, 2008

(54) SYSTEM AND METHOD FOR REVERSE ERROR CORRECTION CODING

(75) Inventors: Jin Lu, Lafayette, CO (US); Keith G. Boyer, Broomfield, CO (US)

(73) Assignee: Storage Technology Corporation, Louisville, CO (US)

( * ) Notice: Subject to any disclaimer, the term of this patent is extended or adjusted under 35 U.S.C. 154(b) by 35 days.

(21) Appl. No.: 11/272,265

(22) Filed: Nov. 10, 2005

(51) Int. Cl.
*H03M 13/00* (2006.01)

(52) U.S. Cl. .................. 714/755; 714/790; 714/795; 714/746; 714/780; 714/784; 375/262; 375/341

(58) Field of Classification Search .................. 714/755
See application file for complete search history.

(56) References Cited

U.S. PATENT DOCUMENTS

| | | | | |
|---|---|---|---|---|
| 6,064,586 A * | 5/2000 | Snyder et al. | ............... | 365/125 |
| 6,108,386 A * | 8/2000 | Chen et al. | ............... | 375/341 |
| 6,513,139 B2 * | 1/2003 | Gray | ............... | 714/771 |
| 6,553,145 B1 * | 4/2003 | Kang et al. | ............... | 382/239 |
| 6,965,652 B1 * | 11/2005 | Burd et al. | ............... | 375/341 |
| 7,010,064 B2 * | 3/2006 | Penther | ............... | 375/340 |
| 7,281,190 B2 * | 10/2007 | Souvignier et al. | ............... | 714/755 |
| 2001/0052101 A1 * | 12/2001 | Gray | ............... | 714/769 |
| 2005/0138522 A1 * | 6/2005 | Silvus | ............... | 714/758 |
| 2005/0168358 A1 * | 8/2005 | Kuznetsov et al. | ............... | 341/59 |
| 2006/0164263 A1 * | 7/2006 | Park et al. | ............... | 341/50 |
| 2006/0174185 A1 * | 8/2006 | Krachkovsky et al. | ............... | 714/801 |

\* cited by examiner

*Primary Examiner*—Cynthia Britt
*Assistant Examiner*—John P Trimmings
(74) *Attorney, Agent, or Firm*—Brooks Kushman P.C.

(57) ABSTRACT

A system and method for Reverse Error Correction Coding. The system includes a Constraint encoder, an Error Correction Code encoder, and a uniform interleaver. The Constraint encoder receives a source data stream and generates a first intermediate encoded data stream satisfying a first predetermined timing data constraint. The Error Correction Code encoder receives the first intermediate encoded data stream and generates a second intermediate encoded data stream having one or more Error Correction Code based elements. The uniform interleaver receives the second intermediate encoded data stream and generates a channel data stream having the one or more Error Correction Code based elements and satisfying a second predetermined timing data constraint.

19 Claims, 3 Drawing Sheets

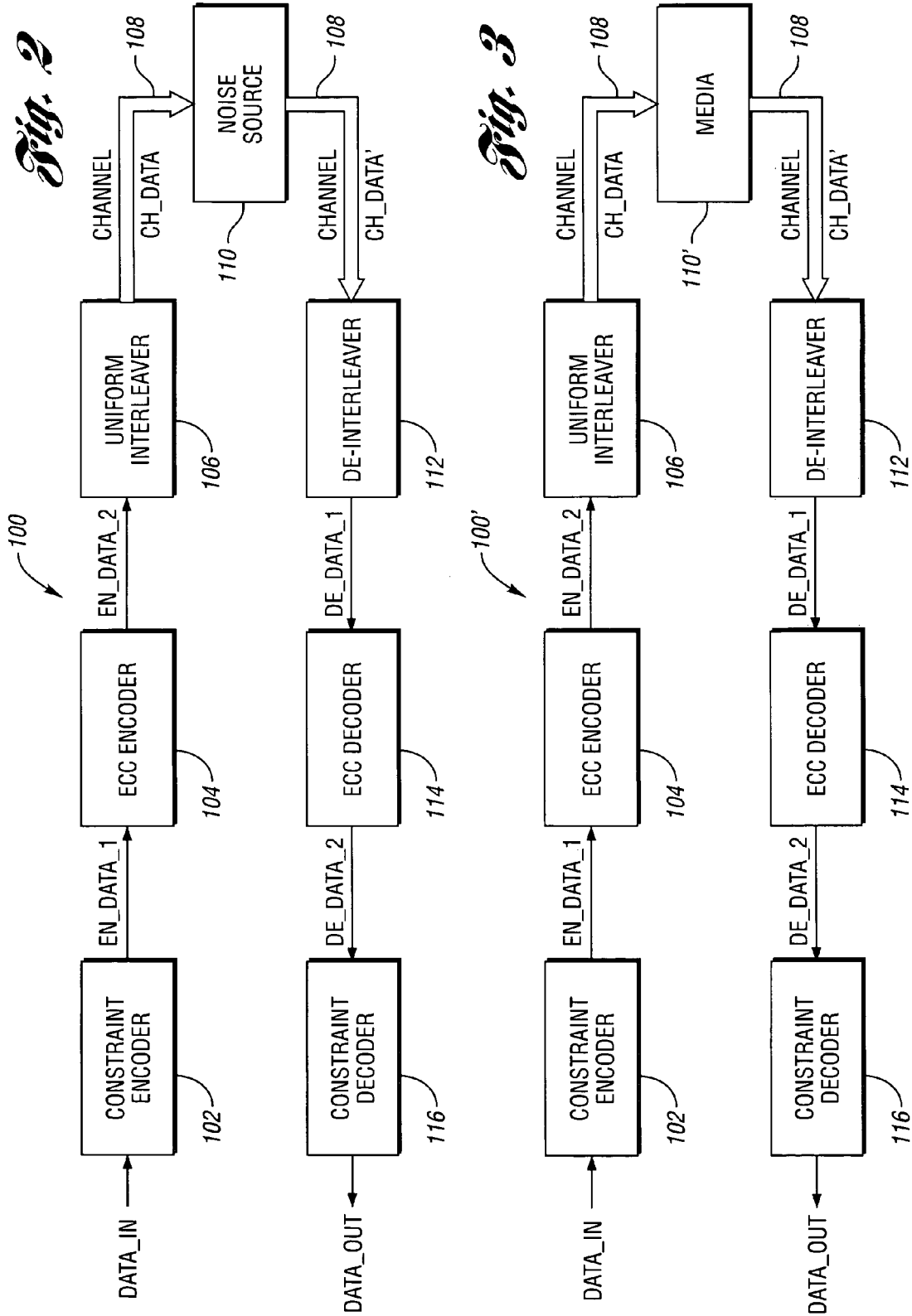

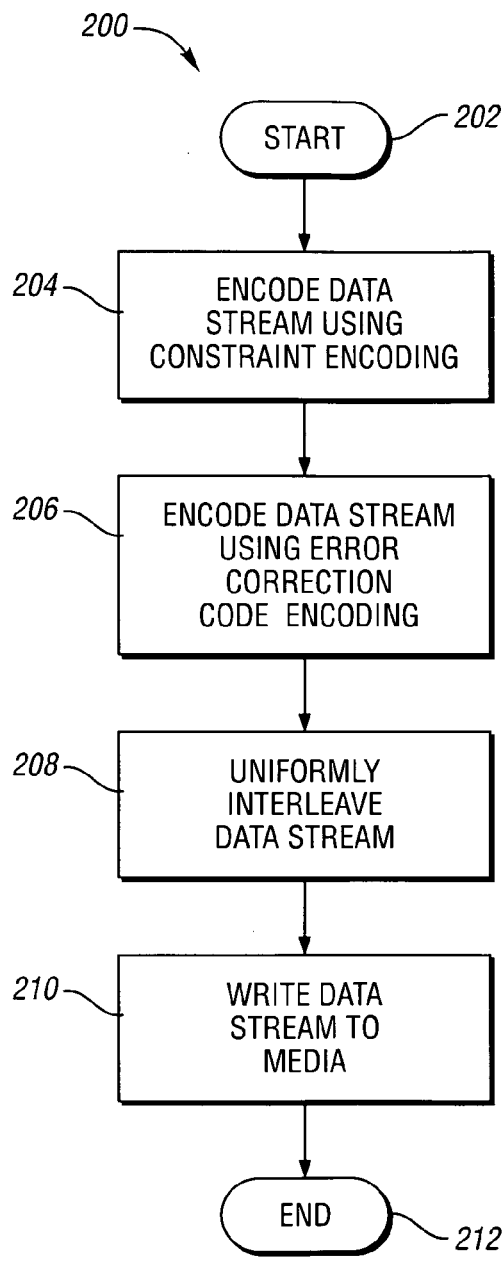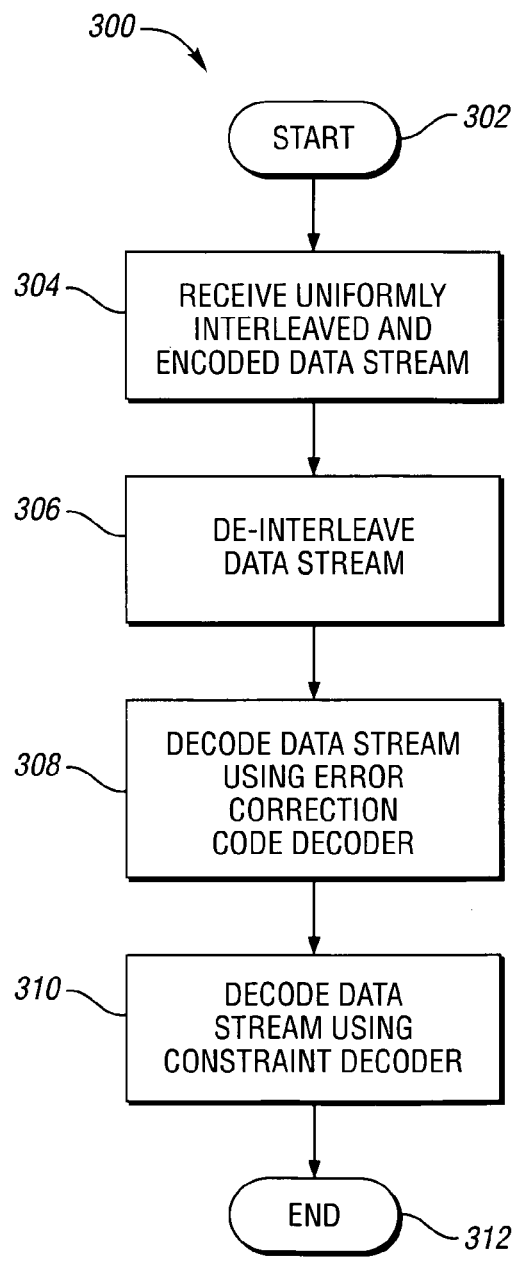
*Fig. 4*          *Fig. 5*

SYSTEM AND METHOD FOR REVERSE ERROR CORRECTION CODING

BACKGROUND OF THE INVENTION

1. Field of the Invention

The present invention relates to Error Correction and Constraint Coding and, in particular, to a system and method for Reverse Error Correction Coding.

2. Background Art

Error Correction coding/decoding (ECC) and Constraint encoding/decoding, such as Run Length Limited encoding/decoding (i.e., RLL) and Variable Rate Randomizer encoding/decoding (VR2), are generally implemented in conventional data communication systems to provide increased data reliability during data transfer over a noise inducing medium (e.g., to/from a magnetic media, etc.).

ECC encoding generally involves appending data, such as one or more parity bits, to a source data stream presented to an ECC encoder. The appended data may provide data redundancy such that the source data may be recovered in the event the noise inducing medium introduces one or more errors into the source data.

In contrast, Constraint encoding is generally implemented to insure, inter alia, that adequate timing information is present in a data stream. The timing information may be used by a tracking mechanism, such as a clock, to synchronize one or more data handling elements (e.g., a read and/or write element) with the data stream such that intersymbol interference may be reduced. In general, timing information may be deemed adequate when the resulting data stream (i.e., Constraint encoded data stream) satisfies a predetermined k-constraint. For example, when the predetermined k-constraint is (0,9), the timing information may be deemed adequate when the resulting data stream has no more than nine 0-bits between consecutive 1-bits. Satisfying a predetermined k-constraint generally provides adequate timing information in systems wherein a timing mark is generally coincident with a high signal state (e.g., coincident with a 1-bit). An example of such a system may be a magnetic media drive wherein a write mechanism of the drive generates a new magnetic mark coincident with the occurrence of a high signal state in the written data stream. The magnetic marks may synchronize a clock of the drive such that a subsequent read element may be synchronized with the written data stream.

FIG. 1 illustrates a conventional system 10 for communicating data. Because an ECC encoder generally appends (i.e., adds, inserts) additional data bits to a data stream, the system 10 generally implements an ECC encoder 12 prior to a Constraint encoder 14. Accordingly, the data bits inserted by the ECC encoder 12 are available at the subsequent Constraint encoder 14 for processing such that the resulting (i.e., processed) data stream, as a whole, satisfies a predetermined k-constraint. As illustrated in FIG. 1, the decoding process is generally the reverse of the encoding process and may include a Constraint decoder 16 receiving a previously encoded data stream and passing a Constraint decoded data stream to a subsequent ECC decoder 18.

Due to the non-linear nature of RLL, VR2 and other Constraint encoding/decoding algorithms, an error introduced into an encoded data stream may be propagated upon subsequent Constraint decoding (e.g., via Constraint decoder 16). Such propagation may increase the quantity and/or severity of errors such that the subsequent ECC decoder 18 is unable to successfully correct the errors.

Furthermore, many Constraint coding algorithms, such as RLL and VR2, are unable to output "soft information" (i.e., probability information having a value between 0 and 1). Accordingly, the system 10 is not suitable for implementing soft ECC decoding, such as a Low-Density Parity-Check decoder (i.e., LDPC).

One attempt to address the shortfalls of the system 10 may be referred to as Reverse ECC. In Reverse ECC, a data stream is generally subjected to Constraint encoding prior to ECC encoding. Accordingly, the encoded data stream is generally subjected to ECC decoding prior to Constraint decoding. Such a system may reduce error propagation and/or allow for implementation of soft ECC decoding. However, additional Constraint encoding (e.g., a second RLL encoding) must be performed on the data bits amended by the ECC encoder as the amended bits may otherwise cause the resulting (i.e., encoded) data stream to violate the predetermined k-constraint.

An attempt to address the shortfalls of Reverse ECC is disclosed in United States Patent Publication no. 2005/01385522 to Silvus (i.e., Silvus). Silvus teaches a system and method for implementing Reverse ECC without requiring a second RLL code. Silvus appends a "seed" to the RLL encoded data. The "seed" alters the parity values of the ECC so that they meet an RLL constraint. However, Silvus requires the determination and insertion of an appropriate "seed" (i.e., any symbol, bit, word or other data inserted in to the channel data which is selected to meet a desired RLL constant). Determination of an appropriate seed may require several iterations.

Accordingly, it would be desirable to have a system and a method for implementing Reverse ECC to reduce error propagation and/or provide "soft information" Error Correction Coding wherein the output of the ECC encoder may be made to satisfy a predetermined k-constraint without requiring a second Constraint encoding and/or the use of an iterative seeding process.

SUMMARY OF THE INVENTION

According to one embodiment of the present invention, a system is provided for Reverse Error Correction Coding. The system comprises a Constraint encoder, an Error Correction Code encoder, and a uniform interleaver. The Constraint encoder receives a source data stream and generates a first intermediate encoded data stream satisfying a first predetermined timing data constraint. The Error Correction Code encoder receives the first intermediate encoded data stream and generates a second intermediate encoded data stream having one or more Error Correction Code based elements. The uniform interleaver receives the second intermediate encoded data stream and generates a channel data stream including the one or more Error Correction Code based elements and satisfying a second predetermined timing data constraint.

According to another embodiment of the present invention, a method is provided for Reverse Error Correction Code encoding. The method comprises the steps of encoding a source data stream using a Constraint encoder to generate a first intermediate encoded data stream, encoding the first intermediate encoded data stream using an Error Correction Code encoder to generate a second intermediate encoded data stream having one or more Error Correction Code based elements, and uniformly interleaving the second intermediate encoded data stream using a uniform interleaver to generate a channel data stream. The first intermediate encoded data stream satisfies a first predetermined timing data constraint and the channel data stream satisfies a second predetermined timing data constraint.

According to yet another embodiment of the present invention, a method is provided for Reverse Error Correction Code decoding. The method comprises the steps of receiving an uniformly interleaved encoded channel data stream, de-interleaving the channel data stream using a de-interleaver to generate a first intermediate decoded data stream, decoding the first intermediate decoded data stream using an Error Correction Code decoder to generate a second intermediate decoded data stream, and decoding the second intermediate decoded data stream using a Constraint decoder to generating a decoded data stream.

BRIEF DESCRIPTION OF THE DRAWINGS

FIG. 2 is a schematic diagram of a system for Reverse Error Correction Coding according to an embodiment of the present invention;

FIG. 3 is a schematic diagram of a system for Reverse Error Correction Coding according to another embodiment of the present invention;

FIG. 4 is a flow diagram of a method for Reverse Error Correction Coding encoding according to an embodiment of the present invention; and FIG. 5 is a flow diagram of a method for Reverse Error Correction Coding decoding according to an embodiment of the present invention.

DETAILED DESCRIPTION

Figure 1:
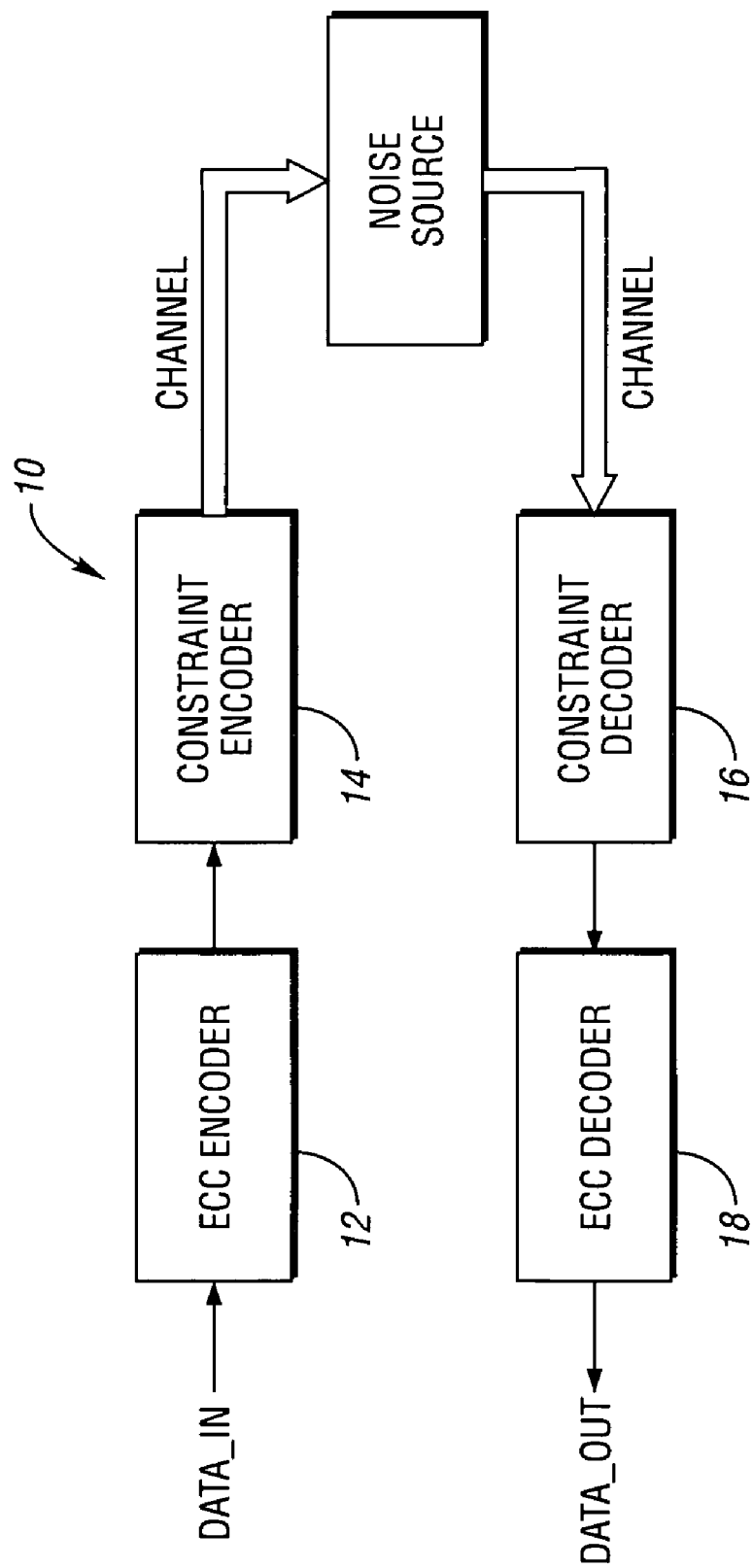
FIG. 1 is a schematic diagram of a conventional system for communicating data.

Referring to FIG. 2, a schematic diagram is provided of a system 100 for Reverse Error Correction Coding according to an embodiment of the present invention. The system generally comprises a Constraint encoder 102, an Error Correction Code encoder (i.e., ECC encoder) 104, a uniform interleaver 106, a data channel 108, a noise source 110, a de-interleaver 112, an Error Correction Code decoder (i.e., ECC decoder) 114, and/or a Constraint decoder 116.

The Constraint encoder 102 may be any appropriate constraint based apparatus using any appropriate constraint algorithm to satisfy the design criteria of a particular application. For example, in at least one embodiment, the Constraint encoder 102 may be a Run Length Limited (i.e., RLL) encoder. In at least one other embodiment, the Constraint encoder 102 may be a Variable Rate Randomizer (i.e., VR2) encoder. The Constraint encoder 102 generally receives a source data stream, such as the data stream DATA_IN, and generates a first intermediate encoded data stream (i.e., EN_DATA_1) satisfying a first predetermined timing data constraint. In at least one embodiment, the first predetermined timing constraint may be a k-constraint, and in particular a (0,9) k-constraint such that EN_DATA_1 comprises a series of bit having no more than nine 0-bits between consecutive 1-bits. However, the first predetermined timing constraint may be any appropriate constraint to meet the design criteria of a particular application.

The ECC encoder 104 may be any appropriate ECC apparatus using any appropriate ECC algorithm to satisfy the design criteria of a particular application, such as a Low-Density Parity-Check code apparatus, a Reed-Solomon code apparatus, and the like. The ECC encoder 104 generally receives the data stream EN_DATA_1 and generates a second intermediate encoded data stream (i.e., EN_DATA_2) having one or more Error Correction Code based elements (e.g., one or more parity bits). Because the ECC encoder 104 generally appends (i.e., adds, inserts) data bits to the previously Constraint encoded data stream (i.e., EN_DATA_1), the data stream EN_DATA_2 may violate the first predetermined timing data constraint.

The uniform interleaver 106 may be implemented to modify the data stream EN_DATA_2 such that the generated (i.e., modified) data stream (i.e., CH_DATA) satisfies a second predetermined timing data constraint. The uniform interleaver 106 may be any appropriate interleaving apparatus using any appropriate algorithm to satisfy the design criteria of a particular application. Furthermore, in at least one embodiment, the uniform interleaver 106 may be implemented in connection with a read and/or write interleaver of a media read/write system. The uniform interleaver 106 generally receives the data stream EN_DATA_2 and generates a channel data stream (i.e., CH_DATA) including the one or more ECC based elements (e.g., one or more parity bits) and satisfying the second predetermined timing data constraint.

It has been determined in connection with the present invention that a data stream having B parity bits and C non-parity bits (i.e., information bits, user bits, etc.) may be uniformly interleaved such that the B parity bits are substantially evenly distributed among the C non-parity bits. In particular, the B parity bits are generally distributable such that the number of bits between any two adjacent parity bits is substantially equal to the value of C divided by B (i.e., C/B). However, it should be understood that the uniform interleaver 106 of the present invention may be implemented as any type of interleaver that shuffles (i.e., positions, moves, etc.) the non-parity bits and the parity bits to avoid K consecutive zeros (i.e., satisfy a predetermined k-constraint). For example, in at least one embodiment, the interleaver 106 may be presented with 4096 non-parity bits and 512 parity bits. In the exemplary embodiment, the interleaver 106 may separate every two adjacent parity bits by 7 non-parity bits for the first 256 parity bits and separate every two adjacent parity bits by nine non-parity bits for the remaining 256 parity bits. Accordingly, an original user data stream satisfying a first k-constraint (e.g., a 0, 8 k-constraint) may be interleaved to satisfy a second k-constraint (e.g., a 0, 10 k-constraint).

It has been further determined in connection with the present invention that when a data stream satisfying a (0,K) k-constraint is encoded by an ECC encoder (e.g., 104) having a code rate of P, the encoded data stream may be uniformly interleaved (e.g., via the uniform interleaver 106) such that the resulting data stream satisfies a (0, K+M) k-constraint, wherein $M=\lfloor K(1-P)/P \rfloor+1$. In particular, a source data stream satisfying a (0,K) k-constraint and having only non-parity bits includes, at most, K consecutive 0-bits between adjacent 1-bits. When the ECC encoder has a code rate of P, the uniform interleaver may, by definition, separate every two adjacent parity bits by D non-parity bits, wherein $D=\lfloor P/(1-P) \rfloor$. Accordingly, at most M parity bits are generally inserted into every K consecutive 0-bits of the source data stream, wherein $M=\lfloor K/D \rfloor+1=\lfloor K(1-P)/P \rfloor+1$. Therefore, the number of 0-bits between two 1-bits may be, at most, K+M and the resulting data stream may be said to satisfy a (0, K+M) k-constraint.

In general, K and M may be integer values. P is generally less than 1 and may be defined as $P=S/T$. S generally equals the number of data bits in a source data stream prior to ECC encoding. T generally equals the value of S plus the number of data bits (e.g., parity bits) added by the ECC encoder (i.e., T=S+number of ECC bits). The mathematical symbols $\lfloor$ and $\rfloor$ generally indicate that a value between the symbols is to be rounded to the nearest integer towards minus infinity. However, the value of K(1−P)/P may be modified (e.g., truncated, rounded, etc.) to provide an integer value of M using any mathematical operation or sequence of mathematical operations to satisfy the design criteria of a particular application. In at least one embodiment, the value of P and K may be selected such that the resulting data stream satisfies a (0, K+1) k-constraint (i.e., the value of M is effectively 1). However, the value of P and/or K may be selected to satisfy any appropriate design criteria.

The encoded, uniformly interleaved channel data stream CH_DATA may be transmitted over a data channel 108. The data channel 108 may be any appropriate communication channel to satisfy the design criteria of a particular application. Furthermore, in at least one embodiment, the channel data stream may be further encoded and/or otherwise processed prior to transmission over the data channel 108.

The noise source 110 may be any noise source present in a particular system, such as the system 100. For example, in at least one embodiment, the noise source 110 may be electromagnetic interference. In at least one other embodiment, the data channel 108 may be a media read and/or write data channel and the noise source 110 may be a noise inducing media (i.e. noise inducing data media), such as a magnetic disk, magnetic tape, an optical disk, a blue-laser optical disk, a holographic disk, and the like. In general, noise may be defined as any (e.g., random, patterned, etc.) unwanted interference (e.g., electrical, electromagnetic, optical, etc.) that may undesirably modify the content of a data stream. It should be understood that the noise source 110 is not an essential element of the present invention. It is contemplated that some systems incorporating the present invention may not, in actuality, experience appreciable noise. The noise source 110 is generally illustrated to reflect the possibility that a data stream transmitted via the data channel 108 may experience (i.e., be subjected to) noise in a real world application.

The de-interleaver 112 may be any appropriate de-interleaving apparatus using any appropriate algorithm to satisfy the design criteria of a particular application. The de-interleaver 112 generally receives encoded data (e.g, CH_DATA where the prime designation represents that CH_DATA may have been modified, such as by the noise source 110) from the channel 108 and/or other data source and generates a first intermediate decoded data stream (i.e., DE_DATA_1). In general, the de-interleaver 112 may perform an inverse of an operation performed by the interleaver 106. That is, the first intermediate decoded data stream may be identical or substantially similar to the second intermediate encoded data stream (i.e., DE_DATA_1 may correspond to EN_DATA_2). In at least one embodiment, a Channel Detector (not shown), such as a Soft Output Viterbi Algorithm (SOVA) Channel Detector, may be implemented in connection with (e.g., prior to, etc.) the de-interleaver 112 to determine when data is present on the channel 108 and/or provide "soft information" for use by the ECC decoder 114.

The ECC decoder 114 may be any appropriate ECC apparatus using any appropriate ECC algorithm to satisfy the design criteria of a particular application, such as hard decoding, soft decoding (e.g., a Low-Density Parity-Check code apparatus), and the like. The ECC decoder 114 generally receives the data stream DE_DATA_1 and generates a second intermediate decoded data stream (i.e., DE_DATA_2). In general, the ECC decoder 114 may perform an inverse of an operation performed by the ECC encoder 104. That is, the second intermediate decoded data stream may be identical or substantially similar to the first intermediate encoded data stream (i.e., DE_DATA_2 may correspond to EN_DATA_1). Because the ECC decoder 114 is implemented prior to the Constraint decoder 116, "soft information" may be presented to the ECC decoder 114. Accordingly, the ECC decoder 114 may be a soft decoding enabled ECC apparatus such as a Low-Density Parity-Check code apparatus and/or the like. Similarly, the ECC decoder 114 is generally not subjected to Constraint decoder 116 induced error propagation.

The Constraint decoder 116 may be any appropriate constraint based apparatus using any appropriate constraint algorithm to satisfy the design criteria of a particular application. For example, in at least one embodiment, the Constraint decoder 116 may be a Run Length Limited (i.e., RLL) decoder. In at least one other embodiment, the Constraint decoder 116 may be a Variable Rate Randomizer (i.e., VR2) decoder. The Constraint decoder 116 generally receives the data stream DE_DATA_2 and generates a decoded data stream (i.e., DATA_OUT) for outputting to a target device (not shown). In at least one embodiment, the target device may be a requesting device (i.e., a device requesting the data stream DATA_OUT). In general, the Constraint decoder 116 may perform an inverse of an operation performed by the Constraint encoder 102. That is, the decoded data stream may be identical or substantially similar to the source data stream (i.e., DATA_OUT may correspond to DATA_IN).

Referring to FIG. 3, a schematic diagram is provided of a system 100' for Reverse Error Correction Coding according to an embodiment of the present invention. The system 100' may be implemented similarly to the system 100 with the exception that the noise source 110 is illustrated as a noise inducing media (i.e., data media) 110', such as a magnetic disk, magnetic tape, an optical disk, a blue-laser optical disk, a holographic media, and the like. Accordingly, the channel data stream (i.e., CH_DATA) may be written to and/or read from the noise inducing media 110'. The noise inducing media 110' may be implemented in any appropriate communication system to meet the design criteria of a particular application, such as a magnetic disk drive, a magnetic tape drive, an optical disk drive, and the like.

Accordingly, the systems 100, 100', and equivalent systems of the present invention generally implement a uniform interleaver and/or a de-interleaver in Reverse ECC to provide reduced error propagation and/or "soft information" Error Correction Coding without requiring multiple Constraint encodings and/or the use of an iterative seeding process.

Referring to FIG. 4, a flow diagram is provided of a method 200 for Reverse ECC encoding according to an embodiment of the present invention. The method 200 may be advantageously implemented in connection with the system 100 described previously in connection with FIG. 2, the system 100' described previously in connection with FIG. 3, the method 300 described subsequently in connection with FIG. 5, and/or any other appropriate system and/or method to meet the design criteria of a particular application. The method 200 may generally be performed by a logical device, such as a controller, an application specific integrated circuit (i.e., ASIC) and/or the like, implemented in connection with an appropriate system and/or method.

The method 200 generally includes a plurality of blocks or steps that may be performed serially. As will be appreciated by one of ordinary skill in the art, the order of the blocks/steps shown in FIG. 4 are exemplary and the order of one or more block/step may be modified within the spirit and scope of the present invention. Additionally, one or more blocks/steps of the method 200 may be omitted to meet the design criteria of a particular application. Block 202 generally represents an entry point into the method 200.

At block 204, a source data stream (e.g., DATA_IN) may be encoded using a Constraint encoder (e.g., 102) to generate a first intermediate encoded data stream (e.g., EN_DATA_1)

such that the first intermediate encoded data stream generally satisfies a first predetermined timing data constraint (e.g., a first predetermined k-constraint).

At block 206, the first intermediate encoded data stream may be encoded using an Error Correction Code encoder (e.g., 104) to generate a second intermediate encoded data stream (e.g., EN_DATA_2) having one or more ECC based elements, such as one or more parity bits.

At block 208, the second intermediate encoded data stream may be uniformly interleaved using a uniform interleaver (e.g., 106) to generate a channel data stream (e.g., CH_DATA). The channel data stream generally satisfies a second predetermined timing data constraint (e.g., a second predetermined k-constraint).

At block 210, the channel data stream may be written to a media (i.e., data media), such as the media 110', and/or otherwise subjected to a noise source (e.g., 110) via one or more data channels (e.g., 108).

Block 212 generally represents an exit point out of the method 200.

Referring to FIG. 5, a flow diagram is provided of a method 300 for Reverse ECC decoding according to an embodiment of the present invention. The method 300 may be advantageously implemented in connection with the system 100 described previously in connection with FIG. 2, the system 100' described previously in connection with FIG. 3, the method 200 described previously in connection with FIG. 4, and/or any other appropriate system and/or method to meet the design criteria of a particular application. The method 300 may generally be performed by a logical device, such as a controller, an application specific integrated circuit (i.e., ASIC) and/or the like, implemented in connection with an appropriate system and/or method.

The method 300 generally includes a plurality of blocks or steps that may be performed serially. As will be appreciated by one of ordinary skill in the art, the order of the blocks/steps shown in FIG. 5 are exemplary and the order of one or more block/step may be modified within the spirit and scope of the present invention. Additionally, one or more blocks/steps of the method 300 may be omitted to meet the design criteria of a particular application. Block 302 generally represents an entry point into the method 300.

At block 304, a uniformly interleaved, encoded (i.e., ECC encoded and Constraint encoded) channel data stream (e.g., CH_DATA') is generally received. In at least one embodiment, the uniformly interleaved, encoded channel data stream may be received and/or otherwise read from a data media (e.g., 110'). However, the uniformly interleaved, encoded channel data stream may be received from any appropriate data source, including any appropriate noise source (e.g., 110), to meet the design criteria of a particular application.

At block 306, the channel data stream may be de-interleaved using a de-interleaver (e.g., 112) to generate a first intermediate decoded data stream (e.g., DE_DATA_1). In at least one embodiment, the first intermediate decoded data stream may be identical or substantially similar to the second intermediate encoded data stream (i.e., DE_DATA_1 may correspond to EN_DATA_2).

At block 308, the first intermediate decoded data stream may be decoded using an Error Correction Code decoder (e.g., 114) to generate a second intermediate decoded data stream (e.g., DE_DATA_2). In at least one embodiment, the second intermediate decoded data stream may be identical or substantially similar to the first intermediate encoded data stream (i.e., DE_DATA_2 may correspond to EN_DATA_1).

At block 310, the second intermediate decoded data stream may be decoded using a Constraint decoder (e.g., 116) to generate a decoded data stream (e.g., DATA_OUT). In at least one embodiment, the decoded data stream may be identical or substantially similar to the source data stream (i.e., DATA_OUT may correspond to DATA_IN).

Block 312 generally represents an exit point out of the method 300.

Accordingly, the methods 200, 300, and equivalent methods of the present invention generally implement uniform interleaving and/or de-interleaving in Reverse ECC to provide reduced error propagation and/or "soft information" Error Correction Coding without requiring multiple Constraint encodings and/or the use of an iterative seeding process.

It is to be understood that like reference numbers indicate like elements in the above detailed description.

In accordance with various embodiments of the present invention, the methods described herein are intended for operation as programs (e.g., software, firmware, etc.) running on a processor. Dedicated hardware implementations including, but not limited to, application specific integrated circuits, programmable logic arrays and other hardware devices can likewise be constructed to implement the methods described herein.

It should also be noted that the program implementations of the present invention as described herein are optionally stored on a tangible storage medium, such as: a magnetic medium, a magneto-optical or optical medium, or a solid state medium. A digital file attachment to email or other self-contained information archive or set of archives is considered a distribution medium equivalent to a tangible storage medium. Accordingly, the invention is considered to include a tangible storage medium or distribution medium, as listed herein and including art-recognized equivalents and successor media, in which the program implementations herein are stored.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A system for Reverse Error Correction Coding, the system comprising:
   a Constraint encoder for receiving a source data stream and generating a first intermediate encoded data stream satisfying a first predetermined timing data constraint;
   an Error Correction Code encoder for receiving the first intermediate encoded data stream and generating a second intermediate encoded data stream having one or more Error Correction Code based elements;
   a uniform interleaver for receiving the second intermediate encoded data stream and generating a channel data stream including the one or more Error Correction Code based elements and satisfying a second predetermined timing data constraint, wherein the channel data stream is transmitted across a data channel;
   a de-interleaver for receiving at least one of the channel data stream and a modified channel data stream, and for generating a first intermediate decoded data stream; and
   an Error Correction Code decoder for receiving the first intermediate decoded data stream and generating a second intermediate decoded data stream wherein the Error Correction Code decoder uses a soft coding algorithm for generating the second intermediate decoded data stream.

2. The system of claim 1 further comprising
a Constraint decoder for receiving the second intermediate decoded data stream and generating a decoded data stream.

3. The system of claim 2 wherein the first intermediate decoded data stream is substantially the same as the second intermediate encoded data stream, the second intermediate decoded data stream is substantially the same as the first intermediate encoded data stream, and the decoded data stream is substantially the same as to the source data stream.

4. The system of claim 2 further comprising a data media, wherein the channel data stream is written to the data media and the de-interleaver receives at least one of the channel data stream and the modified channel data stream from the data media.

5. The system of claim 1 further comprising a data media wherein the channel data stream is written to the data media.

6. The system of claim 1 wherein the Constraint encoder is a Run Length Limited (RLL) encoder.

7. The system of claim 1 wherein the Constraint encoder is a Variable Rate Randomizer (VR2) encoder.

8. The system of claim 1 wherein the Error Correction Code encoder is a Low-Density Parity-Check code (LDPC) apparatus.

9. A method for Reverse Error Correction Code encoding, the method comprising:
encoding a source data stream using a Constraint encoder to generate a first intermediate encoded data stream, wherein the first intermediate encoded data stream satisfies a first predetermined timing data constraint;
encoding the first intermediate encoded data stream using an Error Correction Code encoder to generate a second intermediate encoded data stream having one or more Error Correction Code based elements;
uniformly interleaving the second intermediate encoded data stream using a uniform interleaver to generate a channel data stream, wherein the channel data stream satisfies a second predetermined timing data constraint; and
transmitting the channel data stream across a data channel.

10. The method of claim 9 further comprising writing the channel data stream to a data media.

11. The method of claim 10 wherein the data media is a holographic media.

12. The method of claim 9 wherein the Constraint encoder is a Run Length Limited (RLL) encoder.

13. The method of claim 9 wherein the Constraint encoder is a Variable Rate Randomizer (VR2) encoder.

14. The method of claim 9 wherein the Error Correction Code encoder is a Reed-Solomon code apparatus.

15. The method of claim 9 wherein the Error Correction Code encoder is a Low-Density Parity-Check code (LDPC) apparatus.

16. The method of claim 9 wherein:
the first predetermined timing data constraint is (0,K), wherein K is an integer;
the Error Correction Code encoder has a code rate of P, wherein P is less than 1; and
the second predetermined timing data constraint is (0, K+M), wherein $M = \lfloor K(1-P)/P \rfloor + 1$ and M is an integer.

17. A method for Reverse Error Correction Code decoding, the method comprising:
receiving a uniformly interleaved, encoded channel data stream;
de-interleaving the channel data stream using a de-interleaver to generate a first intermediate decoded data stream;
decoding the first intermediate decoded data stream using an Error Correction Code decoder to generate a second intermediate decoded data stream;
decoding the second intermediate decoded data stream using a Constraint decoder to generate a decoded data stream; and
transmitting the channel data stream across a data channel.

18. The method of claim 17 wherein the Constraint decoder is at least one of a Run Length Limited (RLL) decoder and a Variable Rate Randomizer (VR2) decoder.

19. The method of claim 17 wherein the Error Correction Code decoder uses a soft coding algorithm for generating the second intermediate decoded data stream.

* * * * *